US006847155B2

(12) United States Patent
Schwartz et al.

(10) Patent No.: US 6,847,155 B2
(45) Date of Patent: Jan. 25, 2005

(54) ELECTROACTIVE APPARATUS AND METHODS

(75) Inventors: Robert W. Schwartz, Rolla, MO (US); Manoj Narayanan, Clemson, SC (US)

(73) Assignee: Clemson University, Clemson, SC (US)

( * ) Notice: Subject to any disclaimer, the term of this patent is extended or adjusted under 35 U.S.C. 154(b) by 216 days.

(21) Appl. No.: 10/108,203

(22) Filed: Mar. 27, 2002

(65) Prior Publication Data

US 2002/0153807 A1 Oct. 24, 2002

Related U.S. Application Data

(60) Provisional application No. 60/286,131, filed on Apr. 24, 2001.

(51) Int. Cl.[7] .............................................. H01L 41/08
(52) U.S. Cl. ....................... 310/328; 310/330; 310/331; 310/800
(58) Field of Search .......................... 310/328, 330–332

(56) References Cited

U.S. PATENT DOCUMENTS

| | | | | |
|---|---|---|---|---|
| 3,832,580 A | * | 8/1974 | Yamamuro et al. | 310/328 |
| 4,024,355 A | * | 5/1977 | Takahashi | 381/190 |
| 4,186,323 A | * | 1/1980 | Cragg et al. | 310/324 |
| 4,315,433 A | * | 2/1982 | Edelman et al. | 73/514.34 |
| 4,438,364 A | * | 3/1984 | Morison | 310/328 |
| 4,819,486 A | * | 4/1989 | Kunkel et al. | 73/382 R |
| 5,440,194 A | * | 8/1995 | Beurrier | 310/328 |
| 5,471,721 A | | 12/1995 | Haertling | |
| 5,632,841 A | * | 5/1997 | Hellbaum et al. | 156/245 |
| 5,973,441 A | | 10/1999 | Lo et al. | |
| 6,060,811 A | * | 5/2000 | Fox et al. | 310/311 |
| 6,172,445 B1 | | 1/2001 | Heinz et al. | |
| 6,259,188 B1 | * | 7/2001 | Woodard et al. | 310/330 |
| 6,392,329 B1 | * | 5/2002 | Bryant et al. | 310/328 |

FOREIGN PATENT DOCUMENTS

| WO | WO 9845677 A3 | 10/1998 |
|---|---|---|
| WO | WO 9845677 A2 | 10/1998 |

OTHER PUBLICATIONS

PCT Search Report Mar. 5, 2003.
Ounaies, Mossi, Smith, Bernd, Low–field and High–field Characterization of Thunder actuators, pp. 1–10, Langley Research Center, Hampton, Virginia, Apr. 2001.
Li, Furman, Haertling, Finite Element Analysis of Rainbow Ceramics, pp. 434–443, Journal of Intelligent Material Systems and Structures, vol. 8—May 1997.
Li, Haertling, Stress–sensing characteristics of PLZT–based Rainbow ceramics, pp. 425–431, Smart Mater. Struct. 6 (1997).
J. Ballato, Schwartz, A. Ballato, Network Formalism for Modeling Functionally Gradient Piezoelectric Plates and Stacks and Simulations of RAINBOW Ceramic Actuators, pp. 462–476, IEEE Transactions on Ultrasonics, and Frequency Control, vol. 48, No. 2, Mar. 2001.

(List continued on next page.)

*Primary Examiner*—Mark Budd
(74) *Attorney, Agent, or Firm*—Dority & Manning, P.A.

(57) ABSTRACT

High performance electromechanical devices suitable for a wide range of applications are described. The electroactive devices are capable of operating in a manner that offers enhanced mechanical displacement responses and increased load-bearing capabilities. In one embodiment, the device is capable of providing a significantly increased level of free displacement. The electroactive devices include an electroactive composite which includes at least one electroactive material that may comprise an electrostrictive or a piezoelectric material and a tensioning device which is adapted for inducing a mechanical pre-load to the electroactive composite structure. The tensioning device exerts a mechanical pre-load upon the electroactive material which alters stress profile, increases mechanical energy and increases stored elastic energy of the electroactive devices.

35 Claims, 8 Drawing Sheets

OTHER PUBLICATIONS

Schwartz, Moon, Domain configuration and switching contributions to the enhanced performance of rainbow actuators, SPIE Smart Structures and Materials, Active materials: Behavior and Mechanics, 4333, 408 (201).

Schwartz, Cross, Wang, Estimation of the Effective $d_{31}$ Coefficients of the Piezoelectric Layer in Rainbow Actuators, pp. 2563–2569, J. Am. Ceram. Soc., 84[11] 2563–69 (2001).

Wang, Cross, Tip Deflection and Blocking Force of Soft PZT–Based Cantilever Rainbow Actuators, pp. 103–110, J. Am. Ceram. Soc. 82 [1] 103–10 (1999).

Li, Furman, Haertling, Stress–Enhanced Displacements in PLZT Rainbow Actuators, pp. 1382–1388, J. Am. Ceram. Soc. 80 [6] (1997).

Dausch, Asymmetric 90° Domain Switching In Rainbow Actuators, pp. 31–45, Piezoelectriconics, 1998, vol. 210.

Hooker, Properties and Performance of RAINBOW Piezoelectric Actuator Stacks, pp. 413–420, SPIE vol. 3049 (1997).

Wise, Hardy, Dausch, Design and Development of an Optical Path Difference Scan Mechanism for Fourier Transform Spectrometers using High Displacement RAINBOW Actuators, pp. 342–349, SPIE, vol. 3044 (1997).

Dausch, Low–Field and High–Field Fatigue in PZT–Based Rainbow Actuators, pp. 1044–1051, Journal of Intelligent Material Systems and Structures, vol. 8–Dec. 1997.

Haertling, Rainbows and Ferrofilms—Smart Materials for Hybrid Microelectronics, pp. 70–97, Hybrid Microelectronic Materials.

Jordan, Qunaies, Tcheng, Electrical Properties and Power Considerations of a Piezoelectric Actuator, pp. 1–8, National Aeronautics and Space Administration, Feb. 2000.

Haertling, Ultra–High–Displacement Actuator, pp. 93–96, Feature, vol. 73, No. 1, Jan. 1994.

Schwartz, Robert W., "Estimation of the Effective Piezoelectric $d_{31}$ Coefficients of Rainbow Ceramics and Comments On Their Enhanced Performance", Presented at the $102^{nd}$ Annual Meeting of the American Ceramic Society (Paper A2–114), St. Louis, MO, May, 2000.

* cited by examiner

ELECTROACTIVE APPARATUS AND METHODS

CROSS-REFERENCE TO RELATED APPLICATIONS

This application claims priority to an earlier filed provisional U.S. patent application Ser. No. 60/286,131 filed Apr. 24, 2001 entitled "Electroactive Apparatus and Methods".

BACKGROUND OF THE INVENTION

Electroactive composites include piezoelectric and electrostrictive materials. Piezoelectric and electrostrictive materials are those materials which produce dimensional changes when under the influence of an electrical field. Conversely, when put under stress conditions, piezoelectric materials can develop an electrical field, or in open circuit conditions, a polarization.

Conventional, non-stress-biased electroactive devices exhibit relatively limited mechanical displacements when an electric field is applied. These devices can be generally described as electroactive structures which include at least one piezoelectric or electrostrictive material attached or bonded to at least one other material which can operate as an electrode, support layer, strain amplification material, or the like. The output of such conventional piezoelectric devices is limited by the characteristics of the piezoelectric material, however. Thus, conventional devices of reasonable thickness (i.e. on the order of a few millimeters) in many cases offer mechanical output motion only in the micrometer range.

There is a continuing drive in the industry for devices, such as actuators, that are capable of achieving a greater mechanical displacement for a given voltage. Furthermore, there is a continuing desire in the industry for mechanical devices that can achieve mechanical displacements equivalent to displacement of currently known devices, but using less power.

Commercially available stress-biased piezoelectric and electrostrictive devices provide enhanced displacement and load bearing capabilities as compared to conventional devices and other flextensional devices. These stress-biased devices, as with conventional devices, may be rectangular, square, or circular, but in general they consist of a domed composite structure that results from processing and manufacturing conditions employed in their construction.

U.S. Pat. No. 6,060,811 to Fox, et al. is directed to the mounting of a support layer to induce a stress within an electroactive material in production of a stress-biased electroactive device. The resulting device may be mounted in a variety of configurations for different sensing and actuator applications. One device disclosed by Fox, et al. is sometimes referred to as "THUNDER"®, which is an acronym for a "thin unimorph driver", and is a trademark of the Face International Corporation.

U.S. Pat. No. 5,471,721 to Haertling is directed to methods for making monolithic pre-stressed ceramic devices which are known commercially as "RAINBOW®" devices, an acronym for a "reduced and internally biased oxide wafer". Haertling discloses monolithic, internally asymmetrically stress-biased electrically active ceramic devices and methods for making such devices. The patent discloses the fabrication of a ceramic element having first and second opposing surfaces. The first surface is chemically reduced by heat treatment in a reducing atmosphere, to produce an internally asymmetrically stress-biased ceramic element.

In both the RAINBOW® and THUNDER® devices, composite structures are formed which incorporate a piezoelectric or an electrostrictive layer bonded to a metal layer (as in the THUNDER® device), a cermet layer (as in the RAINBOW® device), or some other suitable substrate layer to form a stress-biased electroactive composite. The specifics of the fabrication procedures that have been employed in the past for these two devices differ, however each procedure results in a stress-biased, domed structure which is formed as a result of the processing conditions employed. As a result of the manufacturing process, stresses of high magnitude develop within the piezoelectric layer. These stresses, notably the tensile stresses in the surface region of the device, have been reported to contribute to the greater observed electromechanical response.

There is a continuing need in the industry for electroactive devices that produce a greater amount of mechanical displacement for a given voltage. Furthermore, electroactive devices that can produce equivalent mechanical displacements using less voltage are also sought after. In some applications, the power consumption of the electroactive devices is extremely critical, such as, for example, space applications and underwater propulsion. In other applications, power consumption is not critical but the amount of mechanical displacement can be very important. There is a continuing need to improve the performance of electroactive devices to increase the efficiency of actuators, pumps, switches, sensors, variable focus lenses, strain gauges, and other components in which such electroactive devices can be employed.

SUMMARY OF THE INVENTION

In general, the present invention is directed to improved electroactive devices and methods for improving the electromechanical response of electroactive devices. More specifically, the electroactive devices of the present invention are formed of an electroactive composite which includes an electroactive material. The electroactive devices also include a tensioning device which induces a mechanical pre-load to the electroactive material.

The electroactive material forming the devices of the present invention can be any electroactive material known in the art. For example, the electroactive material can be formed of a ceramic or a polymer and can display one or more electroactive responses. For example, the electroactive material can be an electrostrictive, a ferroelectric, a piezoelectric, an electrooptic, a pyroelectric, or a magnetostrictive material, or any combination thereof.

The electroactive composite can include other layers in addition to an electroactive material layer. In one embodiment, the electroactive composite can include more than one electroactive material. For example, the electroactive composite can include a piezoelectric material and one or more other electroactive materials.

In addition to one or more electroactive material layers, the electroactive composite can include a support layer. The support layer can be any suitable support layer which supports the electroactive material. For example, the support layer can be formed of a crystalline or amorphous metal, a plastic, glass, cermet, a ceramic, or a carbon fiber composite. Additionally, the electroactive composite of the present invention can include other layers, such as a polyimide layer or an adhesive layer.

In one embodiment, the electroactive composite can include a stress-biased electroactive material with surface tensile stresses that have been previously developed through any of several methods known in the art. Generally, such stress-biased electroactive composites can be curved, with a convex surface and a concave surface. In one embodiment, a stress-biased electroactive material can be included in the electroactive device which is a piezoelectric material. Such an embodiment can include a pair of electrodes attached to the piezoelectric material, one on the concave surface and one on the convex surface.

In general, the tensioning device which induces the mechanical pre-load can be any suitable tensioning device. For example, the tensioning device can be an elastic member, such as, for example, a silicone rubber, a natural rubber, a neoprene rubber, a butyl rubber, a chlorosulfonated polyethylene, or an elastomeric material. Alternatively, the tensioning device can be a spring or a vise.

The mechanical pre-load can be induced to the electroactive material by the tensioning device either directly or indirectly. For example, the tensioning device can be located at a distance from the electroactive composite and the mechanical pre-load can be indirectly induced to the electroactive material through the use of weights, movable sleds, or the like. Alternatively, the tensioning device can be in direct contact with the electroactive composite and the mechanical pre-load can be directly induced to the composite from the tensioning device. In one embodiment, the tensioning device can contact the electroactive composite at two opposing points across the composite in order to induce the mechanical pre-load.

In an alternative embodiment, the electroactive device of the present invention can include more than one electroactive composite structure. For example, the electroactive device can include two, three, four or more electroactive composite structures in communication with each other.

The methods of the present invention can improve the electromechanical response of electroactive devices and can alter the static energy balance of the devices. For example, inducing a mechanical pre-load on an electroactive device can increase the mechanical energy of the system, increase the stored elastic energy of the system, and alter the stress profile of the electroactive composite, including an increase in the surface tensile stress of the electroactive material.

In one embodiment, the addition of the mechanical pre-load to the electroactive device can deform the electroactive composite such that the amount of stored elastic energy is increased. Upon operation of the device, this stored elastic energy can be partially released which can be a factor in the improved electromechanical response of the device.

The induction of a mechanical pre-load can increase static dome height in domed electroactive structures or alternatively form domes in those structures which do not otherwise exhibit a dome structure, such as a flat unimorph device. In one embodiment, composite structures which previously exhibited a dome structure can have an increase in static dome height of at least about 10%. More specifically, inducing a mechanical pre-load on a domed electroactive composite can increase static dome height by about 25%. The mechanical pre-load can also increase the resistance to deformation such as when the electroactive device is placed under a load through a mass applied to the device.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

Other objects, features and aspects of the present invention are disclosed in or are obvious from the following detailed description.

DESCRIPTION OF PRIOR ART DEVICE

Figure 1:
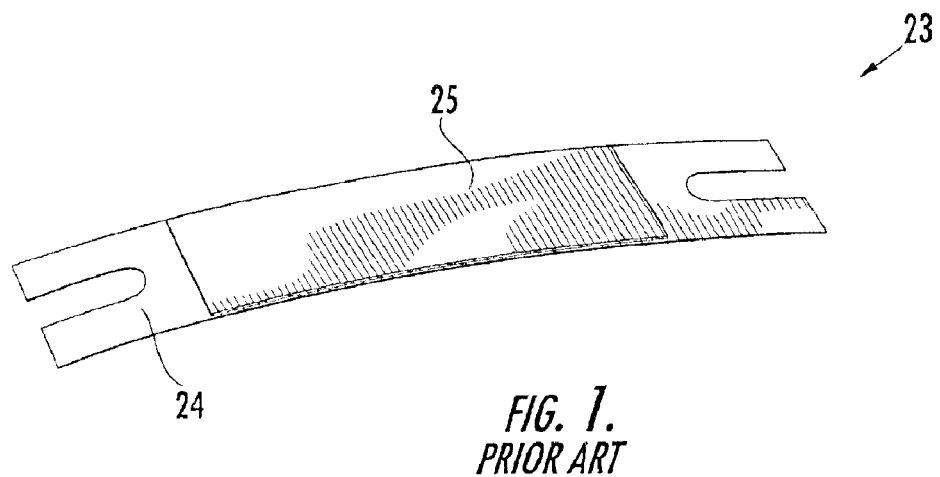
FIG. 1 provides a perspective view of a prior art stress-biased piezoelectric device (sometimes referred to as a THUNDER® device) which includes a layer of ceramic mounted upon a stainless support layer.

FIG. 1 provides a perspective view of a prior art stress-biased piezoelectric device (sometimes referred to as a THUNDER® device). In general, the device 23 includes an electroactive material 25 of compound curvature which is bonded to a curved support layer 24 having a central portion that conforms to the shape of the electroactive material 25. The support layer 24 is made of a flexible, resilient material and may also serve as the pre-stressing layer. The agent used to bond the electroactive material 25 to the support layer 24 may be a polymer, braze alloy, solder, or cerment. Electrical leads can be connected to the convex surface and the concave surface of the electroactive material. Alternatively, the electroactive material layer may include surface electrodes which may be applied by including an electrode layer on opposing surfaces of the electroactive material layer prior to heating the assembly.

DETAILED DESCRIPTION OF THE INVENTION

It is to be understood by one of ordinary skill in the art that the present discussion is a description of exemplary embodiments only, and is not intended as limiting the broader aspects of the present invention, which broader aspects are embodied in the exemplary constructions.

In general, the present invention is directed to improved devices and methods for mounting and using electroactive materials to obtain mechanical displacement capacities greater than those that may be achieved with prior art devices and methods. The invention relates to various electroactive composites including, for example, conventional and stress-biased ceramic electroactive composites which, through the methods of the present invention, can display significant improvements in displacement response and load bearing capabilities.

More specifically, the methods and apparatus of the present invention are directed to incorporation of a mechanical pre-load to electroactive composites through use of a tensioning device to form electroactive devices which display improved electromechanical responses. The addition of the pre-load can induce a new static equilibrium state in an electroactive device. The new static equilibrium state can include, for example, an alteration in stored mechanical energy, elastic energy, and stress profile as compared to an electroactive device which does not include the mechanical pre-load.

Virtually any device that is capable of providing a force between two points can be employed as a tensioning device used in connection with the electroactive devices of the present invention. In one embodiment, the tensioning device of the present invention can be located on the electroactive composite structure itself. Alternatively, a variety of mounting strategies can be utilized in order to yield devices displaying improved electromechanical responses through indirect application of a mechanical pre-load to the electroactive composites when the tensioning device is located at a distance from the electroactive composite structure.

In general, electroactive composites include piezoelectric and electrostrictive materials which produce dimensional changes when under the influence of an electrical field. Piezoelectric materials can additionally develop an electrical field, or in open circuit conditions, a polarization, when put under stress conditions. Electroactive composites can be utilized in actuator or sensor applications. Throughout this disclosure, the term electroactive composite is meant to include any device which is formed of at least one electroactive material attached to at least one other material (including other electroactive materials). Electroactive composites can generally be considered in two major groups, conventional non-stress-biased structures such as unimorph, bimorph and Moonie structures, and stress-biased structures which are formed such that they possess stress profiles.

In forming an electroactive composite, electroactive materials can be attached or bonded to at least one other material in order to provide a utilitarian function to the device. For example, the electroactive material can be directly or indirectly bonded or attached to electrodes, support materials, external structures for achieving strain amplification, or the like in order to produce an electroactive device. In some devices, two electrodes can be attached to the electroactive material, one on either side of the material. In other devices, such as a RAINBOW® device, for example, only one electrode attachment is required, because the reduced side of the piezoelectric material itself can function as the second electrode. Alternatively, the device can be interdigitated, with both positive and negative electrode elements on one surface, or a blanket electrode on one side and segmented electrode on the opposite side of the electroactive material, for those embodiments when only certain regions of the electroactive material will be activated at a time.

A support layer can be included in an electroactive composite structure and may consist of various crystalline or amorphous metals, plastics, ceramics, cermets, amorphous materials such as glass, or composite materials, such as, for example, carbon fiber composite materials. Any suitable support layer is acceptable in the construction of the electroactive composite. In some embodiments, a support layer is not required due to the intrinsic strength of one or more of the other layers in the composite. For example, a single layer of the composite could function as both an electrode and a support layer.

Electroactive composites can be constructed of various electroactive materials such that they possess a large variety of properties such as, for instance, electric field dependent strain (piezoelectric), temperature dependent polarization (pyroelectric), electric field dependent optical birefringence (electrooptic), electric field dependent polarization (ferroelectric), dielectric, magnetostrictive, electrostrictive or any combination thereof.

In one embodiment of the present invention, the electroactive material of the device can be ferroelectric or piezoelectric. In general, in such an embodiment, electrodes of gold, silver, nickel, or any electrically conductive material can be attached to opposite surfaces of the electroactive material. Such devices can be utilized as sensors or actuators.

If desired, the improved electroactive devices of the present invention can be formed using preexisting, prior art electroactive composites, which can then be improved through the present methods. Such devices include, but are not limited to, for example, stress-biased composite structures, "Moonie" flextensional composites, and unimorph, bimorph, multimorph, or monomorph devices.

For example, in one embodiment, pre-existing composite structures, such as flat unimorph and bimorph devices, can be enhanced through the methods of the present invention in order to produce stressed structures displaying enhanced performance characteristics. In one embodiment, the methods of the present invention can produce a domed, stressed electroactive device from a flat prior art device. Such an improved electroactive device can display performance characteristics similar to those of other known stress-biased composites. The production methods of the present invention can be much simpler and less expensive than methods required in the production of other known stress-biased composites.

Alternatively, the methods of the present invention can be utilized to further enhance the performance characteristics of known high performance stress-biased composite structures, such as previously known RAINBOW® and THUNDER® devices. As such, these devices will now be discussed in some detail as typical devices which can be improved through the process of the present invention. It should be understood however, that these devices are discussed for exemplary purposes only, and the presence of these specific devices is not critical to the apparatus and methods of the present invention.

Examples of manufacturing techniques of stress-biased electroactive composites are disclosed in U.S. Pat. Nos. 5,471,721 to Haertling and 6,060,811 to Fox, et al. both of which are incorporated herein by reference thereto. In the manufacture of stress-biased electroactive devices, dome formation can occur in the device due to thermal expansion mismatch between layers of different materials that are bonded together or due to internal asymmetrical biases created in a single layer of the device. For example, in forming the RAINBOW® devices, only one surface of a piezoelectric or electrostrictive material is chemically reduced causing asymmetrical internal stress bias across an individual layer of the device.

During formation of a stress-biased structure, an internal stress profile is developed, including the presence of large tensile stresses in surface regions of the structure while at static equilibrium. For example, in the case of a piezoelectric material which is also ferroelectric, polar regions, or domains, can be formed within a stress-biased structure in a different configuration than is present in conventional, non-stressed devices. Additionally, in the surface region of piezoelectric/ferroelectric stress-biased devices, a greater fraction of the domains may be oriented with their polarization vectors parallel to the surface due in part to the lateral tensile stresses present which are greater than would be expected in standard poled polycrystalline ceramics, i.e., ceramics found in conventional, or non stress-biased devices.

RAINBOW® and THUNDER® actuators are members of a family of stress-biased piezoelectric devices that display enhanced displacement and load-bearing responses over conventional devices. As a result of these attractive performance characteristics, the devices are of interest in applications where high strain is required and device space is restricted, such as for example space-borne mirror positioning systems, vertical cavity surface emitting laser (VCSEL) board positioning, and others. For space-borne applications, such devices can offer reduced power consumption and lighter weight compared to more commonly employed servo motor devices.

RAINBOW® ceramics are fabricated by an elevated temperature process in which a lower region of a piezoelectric lead-based polycrystalline ceramic, such as lead zirconate titanate (PZT), lead magnesium niobate, or other electrostrictive compositions are chemically reduced on one surface through intimate contact with a carbon block at temperatures ranging from about 600–1200° C. The reduced side of the wafer serves as a mechanical support layer and an electrically conductive base electrode, and a metallic electrode need only be deposited on the dielectric side of the wafer to form the electroactive composite, though frequently, an electrode is applied to the reduced side of the wafer as well. Commercial methods for such manufacture are known in the industry and are discussed in Haertling (U.S. Pat. No. 5,471,721).

THUNDER® devices are produced by a different process, but the resulting device is similar, consisting of a domed, composite structure with a piezoelectric element bonded to a metal layer, and a top electrode. The assembly and manufacture of THUNDER® devices is described in U.S. Pat. No. 6,060,811 to Fox, et al.

Device geometry of electroactive devices has been noted to have a significant effect on device performance. This fact has been utilized to prepare devices which generate higher displacement responses through alteration of device geometry. For example, RAINBOW® devices in which approximately 30% to 50% of the piezoelectric layer has been chemically reduced offer enhanced electromechanical response. Suggested contributing factors as to why device geometry affects the strain response of the devices include simple mechanical effects (as might be expected based on the resemblance of the devices to unimorph actuators), and enhanced extrinsic (domain switching) contributions to the electromechanical coupling coefficients due to stress and field effects.

Such domain affects can greatly effect the electromechanical response of a subject device. For example, the piezoelectric coefficients of single domain, single crystal barium titanate ($d_{33}$=85.6 pC/N; $d_{31}$=−34.5 pC/N) are significantly lower than those of poled polycrystalline barium titanate ($d_{33}$=191 pC/N; $d_{31}$=−79 pC/N). Thus, even at low electric fields, the contribution of domain switching more than doubles the effective piezoelectric d-coefficient. At higher electric fields, or in electroactive composites with altered domain configurations, i.e., a configuration with a higher percentage of domains with their polarization vectors parallel to the device surface (a-domains), the importance of such extrinsic effects to response would be expected to be of even greater importance.

X-ray diffraction has been used to characterize the initial domain configuration in the surface region of stress-biased electroactive composites, as well as the domain switching characteristics of such devices under moderate electric fields. Compared to poled polycrystalline ceramics of the same composition, RAINBOW® and THUNDER® actuators display a higher a-domain population in the surface region of the devices. Interestingly, despite the presence of comparatively large lateral tensile stresses in this region of the device, x-ray diffraction indicates these devices also display greater 90° C. (a-to c-domain) switching, which contributes to the large displacement responses that are observed. The contribution of stress to the enhanced performance of RAINBOW® and THUNDER® devices can be described as arising from a change in the initial domain configuration (more a-domains) compared to standard poled polycrystalline ceramics coupled with minimal suppression in the switching response under high lateral tensile stresses.

Electroactive devices of the present invention have been developed which include an increase in lateral tensile stresses in the surface region of the device when in static equilibrium. The alterations in stress state in these devices are brought about through the addition of a mechanical pre-load to the device. The resultant increased stress profile in the composite is believed to contribute to improvement in electromechanical response through both improvement of initial domain configuration as well increasing the domain switching response of the device. At the stress levels present in electroactive composite structures known in the past, tensile stress has only a relatively minor effect on the ability to reorient those domains with their polarization vectors parallel to the surface when an electric field is applied to the structure. It is believed that the processes of the present invention increase stress levels to further alter the domain configuration, while not adversely affecting the switching response. The devices of the present invention can have a higher fraction of domains with polarization parallel to the surface resulting from addition of the mechanical pre-load to the electroactive composite structure. The higher fraction of domains with polarization parallel to the device surface can in turn contribute to a greater electromechanical response when switched to a configuration parallel to an applied electric field.

Alteration in stress profile is not the only factor in the devices of the present invention which is believed to contribute to the improved electromechanical response. Alteration in multiple characteristics of an electroactive composite at static equilibrium condition can be achieved by applying a mechanical pre-load to the device, many of which are believed to contribute to the improved response. For example, it is believed that an increase in tensile stress in a surface of the composite structure, an increase in stored elastic energy and an increase in mechanical energy of the device can all be achieved through application of a mechanical pre-load. While not being held to any particular theory, it is believed that all of these factors can contribute to an improvement in electromechanical response of an electroactive device. As such, electroactive devices have been developed which employ a tensioning device which can induce a mechanical pre-load to an electroactive device so as to improve the elctromechanical response of the electroactive composite.

The term mechanical pre-load is herein defined to describe any mechanical force which can be applied to an electroactive composite structure that can alter the static equilibrium state of the electroactive composite structure. For example, in one embodiment, a commercially available stress-biased composite can have the pre-existing equilibrium state altered by addition of a tensioning device to the composite system such that the resulting electroactive device displays improved electroactive response. In one embodiment, existing RAINBOW® and THUNDER® composites can be fitted with a tensioning device to form the improved electroactive devices of the present invention.

Essentially any device that is capable of providing a force between two points can be employed as the tensioning device of the present invention. For example, the tensioning device can be any suitable device which, when put under tension, will tend to recover its original form or position upon release. For example, the tensioning device can be a coil, a spring, a length of an elastic material, a vise, or the like. Furthermore, the tensioning device can be a single length of a suitable material, which can be connected at either end to other materials, or alternatively, can be formed in a loop with no material end, such as a loop of an elastomeric material, for example.

In one embodiment, the mechanical pre-load may be directly applied to the electroactive composite through the use of a stretched member or an elongated spring attached to the composite. Optionally, the mechanical pre-load may be indirectly applied through an externally applied force which may be incorporated into the composite through a suitable mounting strategy. In either case, a new static equilibrium state can be achieved in the electroactive composite through addition of the tensioning device to the electroactive device.

The material from which the tensioning device may be formed can be any suitable material. For example, metals, alloys, elastomerics, and polymerics or polymeric composites may be employed. The tensioning device of the invention may include an elastomeric member such as silicone rubber, natural rubber, neoprene rubber, butyl rubber, chlorosulphonated polyethylene, or other stretchable elastomeric materials. Other tensioning devices include springs, such as coil springs.

Altering the static equilibrium of the composite structure can alter the nature and improve the performance characteristics of the electroactive material that is present in the electroactive composite. For example, the domain configuration and switching response may be improved by the inclusion of the mechanical pre-load. In addition, it is believed that the tensioning devices used in conjunction with the electroactive composites of the present invention can provide benefit to the resulting electroactive devices through the direct addition of mechanical energy to the system, in the form of the elongated spring or stretched elastomer. An alteration in the equilibrium dome height can be brought about by addition of the tensioning device and can be accompanied by an increase in stored elastic energy of the system, due to the additional deformation that occurs. This added mechanical energy and increased elastic energy can also contribute to the enhanced response of the electroactive devices.

Generally, the optimum mechanical pre-load of the tensioning device can vary depending upon the device application, geometry of the electroactive composite structure, the materials of construction, and the load to be applied to the device, among other factors. In general, the mechanical pre-load applied to a stress-biased electroactive composite can be of a force so as to cause an increase in dome height of the composite without being so large as to cause structural collapse. For example, application of the mechanical pre-load can increase pre-existing dome height by about 10%. More specifically, application of a mechanical pre-load to an electroactive composite can increase pre-existing dome height by about 25%. In those embodiments wherein a mechanical pre-load is being incorporated to a conventional electroactive device which does not exhibit a dome structure, the addition of the mechanical pre-load can cause formation of a domed structure similar to that of a non-modified, stress-biased device. The increase (or formation) of dome height of the improved device is the result of the new balance of forces that exist within the system; i.e., the added tensioning force that is exerted by the tensioning device is equal, but opposite, to the resisting elastic force of the electroactive composite.

The mechanical pre-load can be applied to the electroactive composite structure by any suitable means in order to produce a new static equilibrium condition in the electroactive composite. In addition, the amount of pre-load applied to the electroactive composite may be adjusted to increase or otherwise maximize device response. For example, in one embodiment, springs with various force constants and which can be elongated to different lengths can be used to vary the pre-load applied by the tensioning device. Additionally, location of the tensioning device in relation to the electroactive composite can be altered in order to alter the applied pre-load. For example, in one embodiment the tensioning device can be stretched or extended and then attached directly onto opposite sides of a composite structure which includes the electroactive material. Alternatively, the pre-load can be adjusted or 'tuned' through an indirect attachment to the electroactive composite, such as when the tensioning device is deformed (such as a compressed spring or rubber block) and located at a distance from the electroactive composite structure. Any of a variety of mounting methods may then be employed to allow the mechanical pre-load to be transmitted to the electroactive composite structure through the use of weights, movable sleds, and the like.

Figure 11:
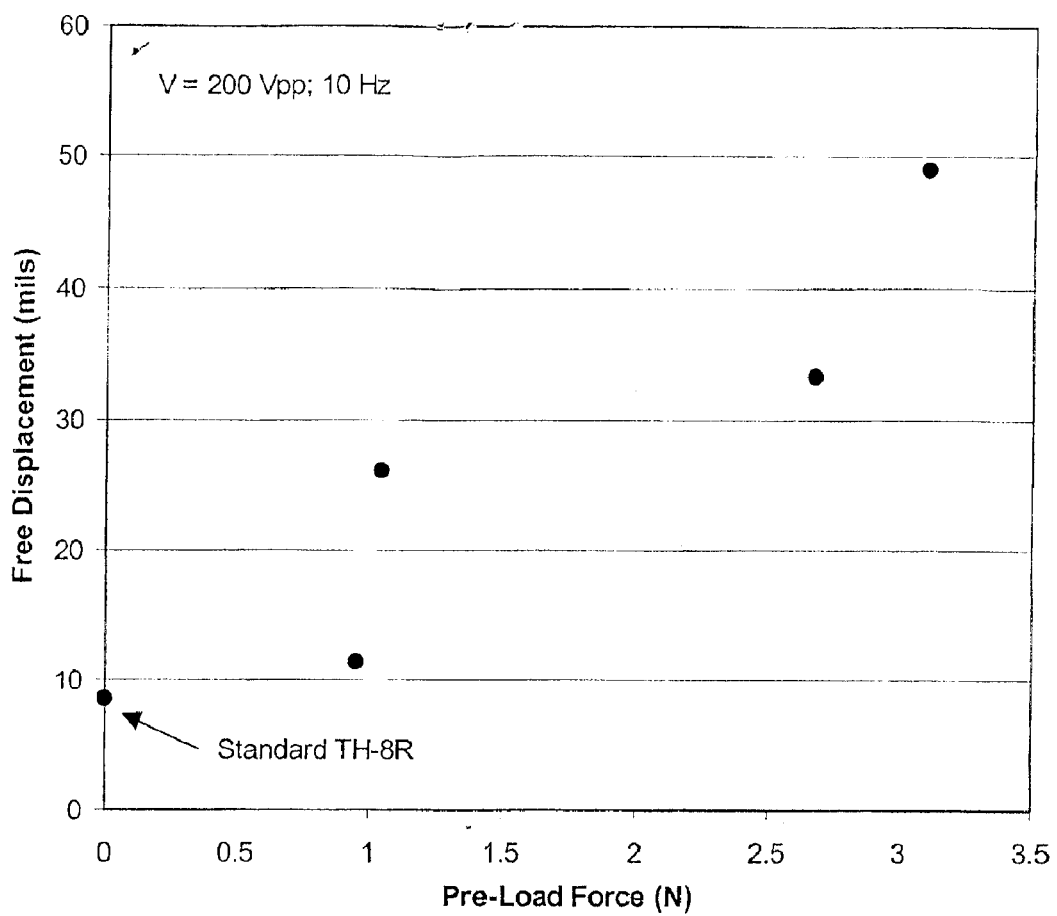
FIG. 11 illustrates the total displacement obtained under an applied voltage at 10 Hz for different mechanical pre-load values.

Conventional and stress-biased prior art devices which have been modified according to the methods of the present invention display a displacement response that is significantly improved over the displacement response of similar but unmodified prior art devices. In addition, the level of pre-load can impact the total displacement capabilities of the electroactive device. For example, FIG. 11 illustrates the free displacement measured in mils, of stress-biased devices which include various levels of mechanical pre-load added to the devices. As can be seen, in general, an increased pre-load force applied to the device leads to an increase in total free displacement.

The additional mechanical energy and increase in stored elastic energy in the electroactive device due to addition of the mechanical pre-load are believed to contribute to the observed improved electromechanical response. For example, in an embodiment wherein the device domes (rather than flattens) under an applied electric field, some of the stored mechanical energy of the tensioning device can be released as the device domes, which can contribute to the improved electromechanical response of the device.

Figure 10:
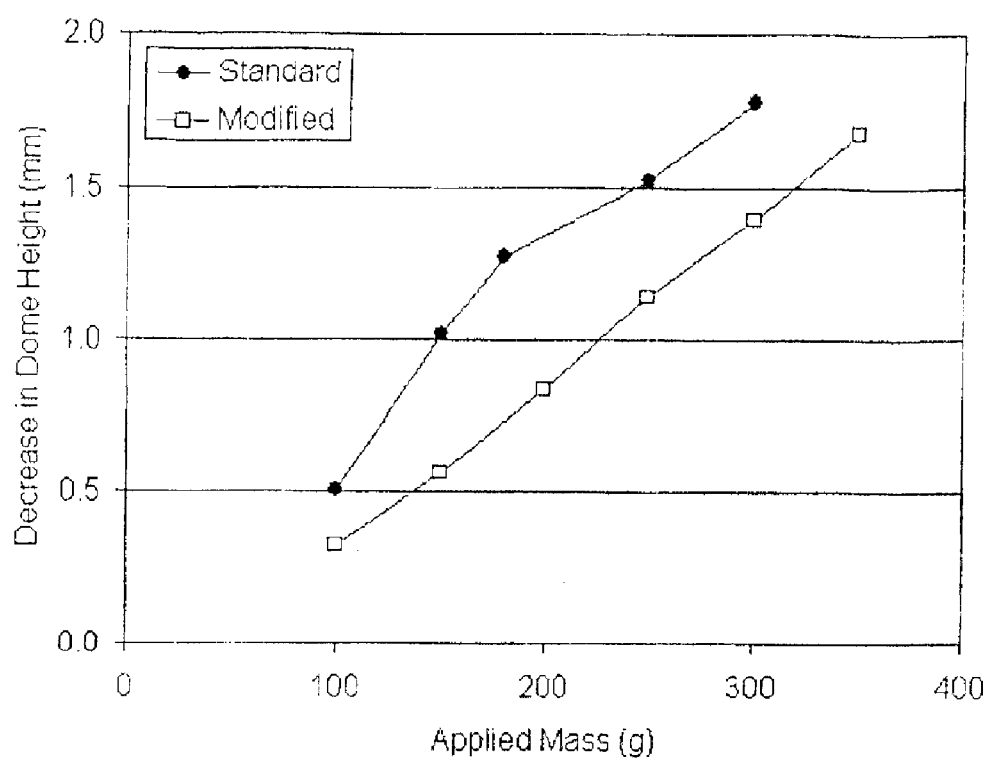
FIG. 10 illustrates the decrease in dome height of prior art and spring-modified actuators under an applied mass.

The addition of the mechanical pre-load can increase the resistance of the composite to deformation under an applied load. FIG. 10 illustrates the load-bearing capabilities of standard devices and improved devices of the present invention under various applied loads. As can be seen, the modified devices display less deformation (flattening) under applied load. For the standard device, a 100 gram mass load results in a 15% reduction in dome height while a 300 gram mass causes a 54% reduction. In contrast, these same mass loads cause, respectively, 7% and 33% dome height reductions for the improved device. For equivalent applied masses, in general, the modified devices deform 30%–40% less than the standard devices. Thus, the improved electroactive devices of the present invention can be more resistant to deformation and show improved shape retention under applied mass.

The dynamic response characteristics of the electroactive device may also be affected by a mass which the device is designed to carry or move upon stimulation. For example, when a domed, electroactive composite structure directly supports a mass, the addition of that mass to the composite structure can tend to flatten the domed structure or otherwise affect the geometry of the device. Flattening of the domed structure can affect the dynamic response characteristics of the device through decrease in the overall stress state of the device, which can result in a decrease in domain switching, and thereby, decrease the electromechanical response of the device. The tensioning device, through the added mechanical pre-load acting on the electroactive composite structure, can reduce the deformation effect of an applied load and thereby enable the device to better retain desired performance characteristics. Thus, whereas with prior art devices, large masses could deform the electroactive composite to the point of inability to function properly, in the present device, the mechanical pre-load can be engineered to compensate for an applied load, and a relatively small electroactive composite structure can generate motion of a relatively large mass.

Various alternative embodiments of the present invention can provide novel and surprisingly high performance electromechanical devices that are suitable for a wide range of applications. Such devices can operate using any suitable electric field, such as, for example, the same type of electric fields that are used in connection with existing THUNDER® or RAINBOW® devices, but offer enhanced displacement response and improved load bearing capabilities compared to prior art devices. For example, where similar or comparable drive voltages are applied, the displacements that may be achieved in the present devices can be six or more times greater than those of previously known devices.

Alternatively, analogous displacement performance to existing THUNDER® and RAINDOW® devices may be achieved in the devices of the present invention using lower operational voltages than were required in the past. For example, to obtain an identical displacement value at a frequency of about 20 Hz, the improved devices can use about 60% to about 70% of the power required in a similar, unmodified device. The difference in power consumption required for an equivalent displacement between devices which include the mechanical pre-load and those which do not can vary depending upon the frequency of the applied voltage. For example, at lower frequencies (less than about 10 Hz) the difference in power consumption can be less, while at higher frequencies, the difference in power consumption can increase.

The improved devices of the present invention can produce high displacements under an applied electrical impulse as well as sustain moderate loads. For example, in one embodiment, the device of the present invention can include an electroactive ceramic composite structure and can offer displacement response as high as 1000% and sustain loads of at least about 20 pounds. For comparison purposes, such strain and load levels can be more than an order of magnitude greater than those obtained with previously known stress-biased and bimorph devices. As such, the methods of the present invention can lead to electroactive devices which can move and/or support applied loads much greater than thought possible in the past. For example, in one embodiment of the present invention an electroactive device can be formed which can support an applied load of about 5 kg. In such embodiments, the tensioning device can be engineered to do the work required to support the applied load, counteracting the force on the actuator due to the presence of the applied load and freeing the actuator to perform work in moving the load. Investigations have shown that irrespective of mass load, a similar range of motion can be achieved for actuators asked to move a broad range of masses, provided that the magnitude of the pre-load force and force resulting from the applied mass are appropriately balanced. The procedures employed to add the pre-load and the mass to the actuator must be carefully followed, however, to avoid unrecoverable (and undesired) plastic deformation of the actuator.

Figure 3:
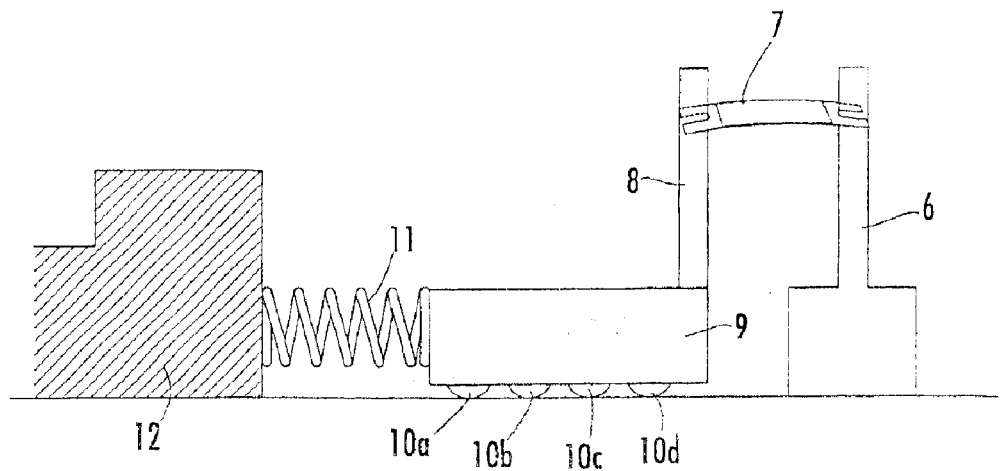
FIG. 3 shows one embodiment of the invention in which a compression spring forces movement of a sled to exert a mechanical pre-load upon an electroactive composite.

FIG. 3 illustrates one possible embodiment of the present invention in which a fixed or immobile post 6 holds an electroactive composite structure such as an actuator 7 at its first end, while a movable post 8 holds the second end of actuator 7. The second end of actuator 7 and movable post 8, are capable of sliding with sled 9, which rests upon bearings 10a–10d (which may or may not be visible). A compressed tensioning device such as a compressed rubber block or spring 11 provides a mechanical pre-load to actuator 7 through sled 9. Compressed spring 11 is attached between a fixed block 12 and the mobile sled 9. The illustrated device can perform work using the vertical motion of actuator 7 when actuator 7 is suitably stimulated, such as through application of an electrical field. Typically, the maximum vertical motion of actuator 7 can occur at its center point. The vertical motion of actuator 7 can then be used to move an attached mass. For example, a mass could be placed on top of the center of actuator 7, or alternatively could be attached to actuator 7 through any of a variety of mounting methods.

Figure 4:
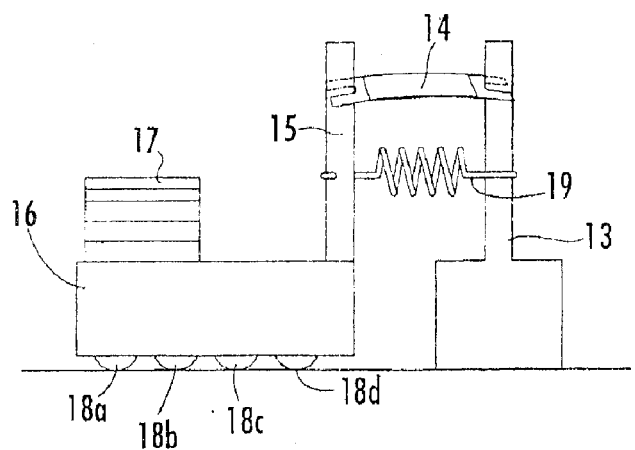
FIG. 4 illustrates one embodiment of the invention in which an actuator is stressed by the action of a spring which exerts a mechanical pre-load on the actuator, drawing the ends of the actuator closer together.

Through the indirect mounting configuration of the tensioning device as illustrated in FIG. 3, the pre-load forces of the tensioning device 11 can be incorporated in the electroactive device while at a location remote from the actuator 7 itself. This can allow for a wide range of pre-load forces to be developed since the pre-load force, while still somewhat dependent on the elastic response of the actuator 7, is more independent of the elastic response of the actuator 7 than is the case for a directly mounted tensioning device, such as is illustrated in FIG. 4. This is because the magnitude of the pre-load force can be adjusted through the location of the fixed block 12 as compared to the movable sled 9; i.e., increased distance can provide for decreased pre-load on the composite structure.

The device of FIG. 3, can also be used in applications for which horizontal positioning and motion of a mass may be required. For example, in one embodiment, a mass which is to be moved could be located on the movable sled 9 such that activation of the system can lead to horizontal motion of the applied mass. One constraint for horizontal motion would be that the desired motion not be impeded through location of the fixed block 12 or fixed post 6. Possible applications of a device such as that of FIG. 3 could include, for example, but are in no way limited to, mirror adjustment in an interferometer, an optical processing computer board, needles in a loom machine, etc.

FIG. 4 illustrates an alternative embodiment of the present invention including a fixed post 13 having an actuator 14 connected between a first point on fixed post 13 and a second point on movable post 15. An extended spring 19 provides a mechanical pre-load to actuator 14 due to pull between post 13 and post 15. The response characteristics and electromechanical performance of the actuator 14 can be impacted through weights 17 added to a movable sled 16 to which movable post 15 is attached. As previously noted, and as is true for all illustrated embodiments, essentially any device capable of providing the mechanical pre-load could be employed in place of spring 19. Bearings 18a–d permit a sliding action to sled 16 which acts in response to spring 19 as well as the electrically stimulated electroactive device. This action can be altered through weights 17.

Similar to the embodiment illustrated in FIG. 3, the motion of the actuator 14 upon applied voltage can be utilized for either vertical or horizontal displacement and work by placing the object to be moved on either the actuator 14 or the sled 16, as desired.

For embodiments such as those illustrated in FIGS. 3 and 4, inertial effects may be used to further improve the response of the electroactive devices. For example the addition of weights 17 to sled 16 in FIG. 4 or alternatively to sled 9 in FIG. 3 (not shown), can increase both vertical and horizontal motion upon voltage application at low frequency to the actuator.

In another alternative embodiment, similar to those illustrated in FIGS. 3 and 4, both ends of the electroactive composite structure could be attached to movable points.

Figure 2:
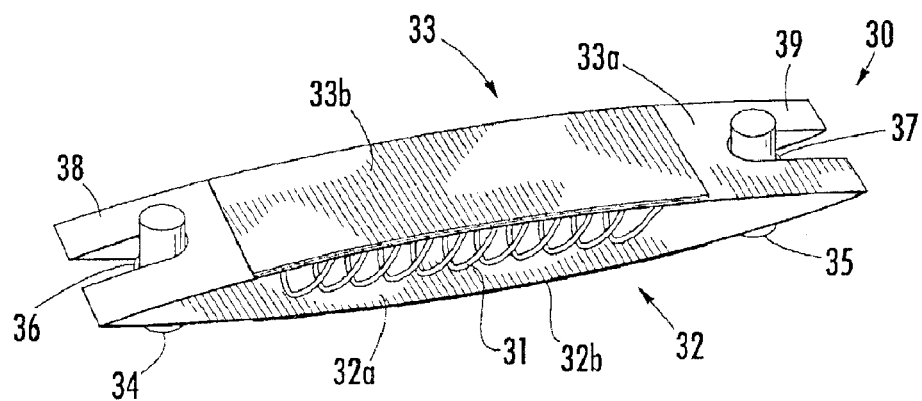
FIG. 2 illustrates one embodiment of the present invention in a clamshell design in which two electroactive composite structures are connected at their ends.

FIG. 2 shows an embodiment of the present invention in a "clamshell" configuration. In this embodiment, two electroactive composite structures, 32 and 33, are employed, to provide an electroactive device 30 capable of generating a range of motion greater than that provided by an equivalent, single composite structure. As can be seen, support layers 32a and 33a are provided in opposed configuration. Upon each respective support layer is one or more layered electroactive materials 32b (hidden) and 33b, respectively. One support layer 32a or 33a and its attached electroactive layers 32b or 33b, respectively, together form the electroactive composite structures 32 and 33.

A first connector device 34 and a second connector device 35 can be located on either end of electroactive device 30. The first end 36 and the second end 37 of extended tensioning device 31 can be attached to the first connector device 34 and second connector device 35, respectively. In general, the connector devices, 34 and 35, will not exceed the sum of the dome heights (in an electrically stimulated flattened configuration) of the electroactive composites 32 and 33, so as to not limit the lateral dimension of a mass to be applied to the top of the electroactive composite. Though shown as cylinders in the Figures, connector devices 34 and 35 can be any suitable shape. For example, connector devices 34 and 35 can vary in cross-section such that they are narrower in the middle than at the ends. Connector devices 34 and 35 can also include means for connecting tensioning devices to the connector devices such as hooks, tabs, receivers, grooves, or the like.

Tensioning device 31 is extended to a desired length in order to provide a mechanical pre-load which acts to pull the connectors, 34 and 35, toward each other which, in turn, pulls opposing ends of actuator 32 toward each other and pulls opposing ends of actuator 33 toward each other. In the embodiment shown in FIG. 2, tensioning device 31 is a stretched coiled spring, but as previously discussed, the tensioning device can be any suitable device which is capable of providing a force between two points.

In an alternative embodiment, more than two electroactive composite structures could be included in a similar device. In such an embodiment, the composite structures can be located similar to the two shown in FIG. 2, between the first connector device 34 and the second connector device 35 such that there are two or more clamshell structures located back to back.

In some applications, first end 38 and second end 39 of the electroactive composite structure can be formed of only the support layer 32b, as shown in FIG. 2. Alternatively, however, the electroactive material can extend to the end of the electroactive composite structure. As such, the connector devices, 34 and 35, could contact the support layer as well as the electroactive material layer(s) of the composite structure.

The tensioning device 31 can be attached to connector devices 34 and 35 near either end of the electroactive device 30 by any suitable method. For example, the ends of tensioning device 31 can be formed of metal or polymeric hooks which can simply loop around connector 34 and 35 when the tensioning device 31 is extended. In order to maintain tensioning device 31 in the center of the electroactive device 30, connectors 34 and 35 can be formed with a groove for the placement of the ends of tensioning device 31. Alternatively, the tensioning device 31 can be in the form of an elastomeric loop which can be simply looped around the connectors 34 and 35. In yet another alternative embodiment, the tensioning device can include a separate attachment device, such as some form of a snap or quick-connect attachment sized to fit into a matching receiver on the connectors 34 and 35. Any suitable attachment will suffice which can withstand the forces exerted by the tensioning device upon deformation and stimulation.

Electroactive composites, 32 and 33 can be constrained to retain the appropriate position on the connectors 34 and 35 through any suitable method. For example, connectors 34 and 35 can be formed with a decreasing diameter toward the middle of the connector. Thus, at the new static equilibrium state and during electrical stimulation, the U-shaped ends of the electroactive composite structures 32 and 33, will not slide off of the ends of the connectors 34 and 35.

In order to operate correctly, the two composite structures 32 and 33 of device 30 must be in contact. If desired, in order to ensure this connection, one or both of the ends of the electroactive composites 32 and 33 can be connected. For example, the ends of the composites 32 and 33 can be connected with a hinge or tape. For example, a plastic hinge connector can be used to connect the ends of electroactive composite structures 32 and 33.

Figure 5:
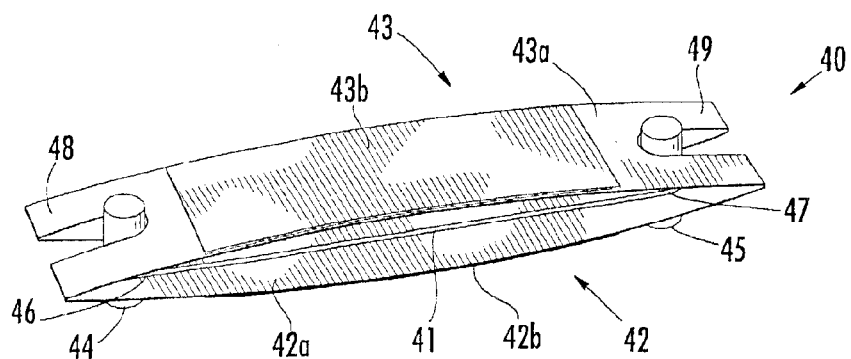
FIG. 5 shows a perspective view of a similar device to that shown in FIG. 2, except that the tensioning device comprises a stretched elastic member.

FIG. 5 shows another alternative electroactive device 40 which, like the embodiment shown in FIG. 2, includes two electroactive composite structures 42 and 43. Support layers 42a and 43a are shown, and each support layer further includes an electroactive material 42b (hidden) and 43b, respectively. A first connector device 44 and a second connector device 45 are shown in FIG. 5. The respective connector devices 44 and 45 are shown in this embodiment as posts, but as in other embodiments they could assume different configurations. The first end 46 and second end 47 of the elastic member 41 is looped around connector devices 44 and 45. Additionally, the first end 48 and the second end 49 of electroactive composite 42 are shown. The elastic member 41 which is looped around connectors 44 and 45 could be selected from any suitable material that has elasticity sufficient to provide a mechanical pre-load between two points when extended. Examples of materials that could be used include silicone rubber, natural rubber, butyl rubber, neoprene rubber, chlorosulfonated polyethylene, and other elastomers or polymeric composites.

Figure 6:
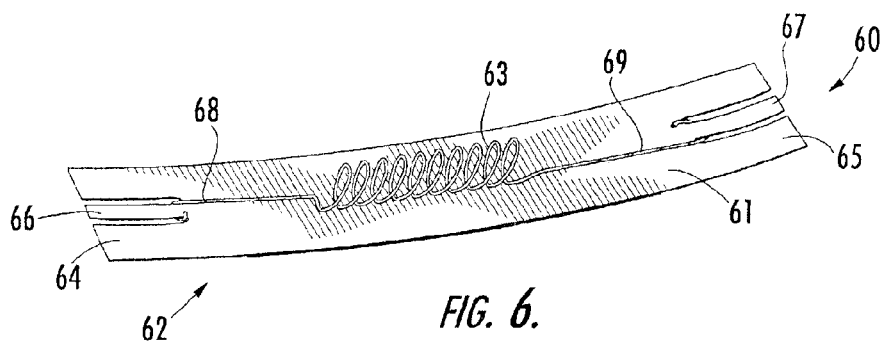
FIG. 6 shows an alternate embodiment of the invention employing an electroactive device having a pre-stressed curved electroactive material mounted upon a support layer wherein the support layer includes a projection at both ends upon which an elongated spring is mounted.

In FIG. 6, another embodiment of an electroactive device 60 is shown. In this embodiment, a support layer is provided 61 which is bonded to an electroactive material 62 (not visible) on one surface. Extended spring 63 is attached to support layer 61 at first end 68 and a second end 69. The first end 64 of the support layer 61 and the second end 65 of the support layer 61 each include a first finger 66 and a second finger 67, respectively. The first finger 66 is adapted for engaging the first end 68 of the spring 63, while the second finger 67 is adapted for engaging the second end 69 of the spring 63. The electroactive material 62 could extend to the end of the device with cut slots at the end or alternatively can only extend part of the length of the support layer 61.

Figure 7:
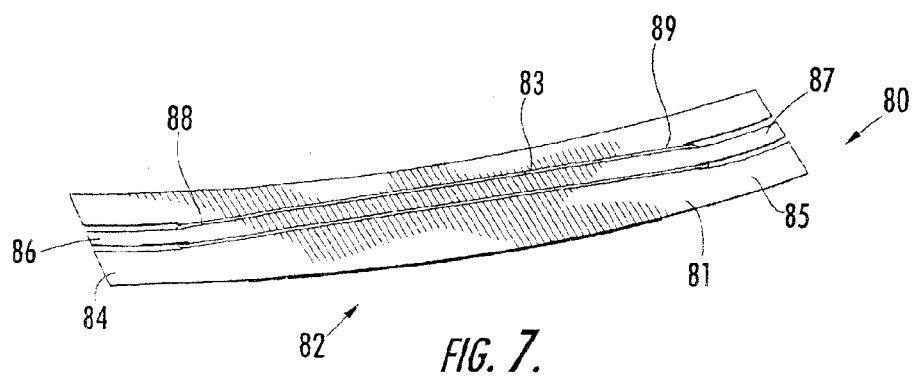
FIG. 7 shows a similar embodiment as that shown in FIG. 6 except that the tensioning device employed is a stretched elastic member.

In FIG. 7, another embodiment of an electroactive device 80 is shown which is similar to the embodiment of FIG. 6, with the exception that elastic member 83 is used instead of a spring 63. For example, in FIG. 7 a support layer 81 having an electroactive material 82 (not visible) on its surface is provided. The elastic member 83 has a first end 88 and a second end 89 which are attached to a first finger 86 and a second finger 87, respectively. The first finger 86 is located at the first end 84 of the electroactive device 80. The second finger 87 is located at the second end 85 of the electroactive device 80.

Additionally, the embodiments illustrated in FIGS. 6 and 7 could also be included in electroactive devices which include more than one electroactive composite structure, such as the clamshell structures illustrated in FIGS. 2 and 5, for example. For example, in an embodiment including two composite structures such as those of FIG. 6 or 7, the tensioning device could be attached to both of the fingers of the two composites where they meet at either end of the device.

In yet another alternative embodiment, actuators such as those of FIGS. 6 and 7 could be stacked in a non-opposing fashion, to create an electroactive device comprising more than one electroactive composite. In such an embodiment, the multiple actuators of the device could be nested, rather than have the clam-shell structure of FIG. 2.

Figure 4A:
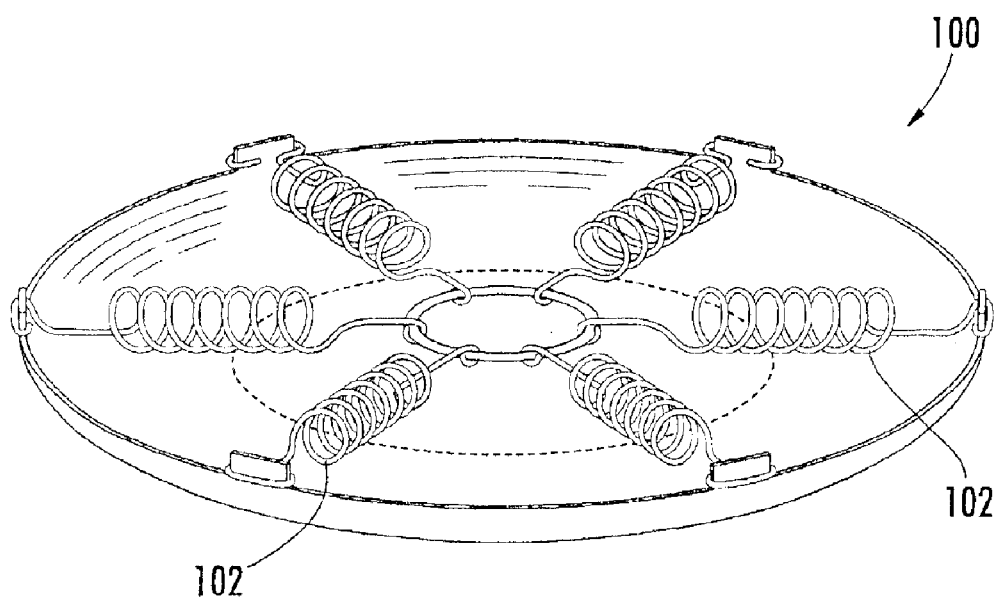
FIG. 4A illustrates another alternative embodiment of the present invention in which the electroactive composite structure is circular.

Of course, the electroactive composite structures need not be rectangles, as illustrated in the above described embodiments. Any suitable shape can be formed. For example, the electroactive composite structure can be a circular structure with the tensioning device imparting a mechanical pre-load across diameters of the circle. For example, FIG. 4A illustrates a stretched tensioning device such as one or more springs 102 attached to sides of a circular electroactive composite 100. Alternatively, a stretched elastomeric band could encircle a circular electroactive composite or be attached via tabs or other attachment devices to provide the mechanical pre-load.

The present invention can provide a simple and cost effective method for producing higher performance electroactive devices. In addition, the present invention can be surface mountable, can require a low inventory of parts, can be highly flexible, and can be used for devices having a range of geometries (circular, square, or rectangular, for example).

Potential applications for the invention include but are not limited to, for example, pumps, automotive and truck applications, needle positioning (i.e. loom) applications, positioners, robot motion systems, underwater propulsion systems, relays, acoustic applications, and the like. Other opportunities for application of the invention include space-based applications such as, but not limited to interferometer mirror positioners. Furthermore, due to higher displacement response, it is possible to use such devices in pumps that can deliver higher volumes of fluid than previously known pumps of the same type.

Reference now will be made to various embodiments of the invention, one or more examples of which are set forth below. Each example is provided by way of explanation of the invention, not as a limitation of the invention. In fact, it will be apparent to those skilled in the art that various modifications and variations can be made of this invention without departing from the scope or spirit of the invention.

EXAMPLE 1

Characterization of one embodiment of the present invention was carried out by modifying preexisting THUNDER® stress-biased actuators. The THUNDER® actuators that were modified according to the teachings of the present invention were manufactured by FACE International Corporation, located in Norfolk, Va. The tensioning devices employed included coil springs.

THUNDER® actuators of model number TH-8R were utilized. The actuators obtained were about 2.5 inches long, and about 0.5 inches wide. The piezoelectric electroded layer was 8 mils thick. The stainless steel support forming the base of the electroactive composite was about 6 mils in thickness. Other layers on the electroactive composite included a layer of high temperature curable polyimide (1 mil) located between the support layer and the piezoelectric, another layer of high temperature curable polyimide (1 mil) located on top of the piezoelectric layer, and a top aluminum layer (2 mil) which served as one of the electrical contacts of the composite.

A THUNDER® device was placed in an apparatus similar to that illustrated in FIG. 4 and a voltage of about 200 volts (no bias) was applied. The displacement response was measured as a total displacement response including all motion in the vertical direction, i.e., both doming and flattening motion. The measurement of displacement response was made with a fiber optic sensor whose output was provided on an oscilloscope. The voltage output of the oscilloscope was converted to a measurement of device displacement (i.e. total motion) using a calibration chart supplied by the manufacturer.

Figure 8:
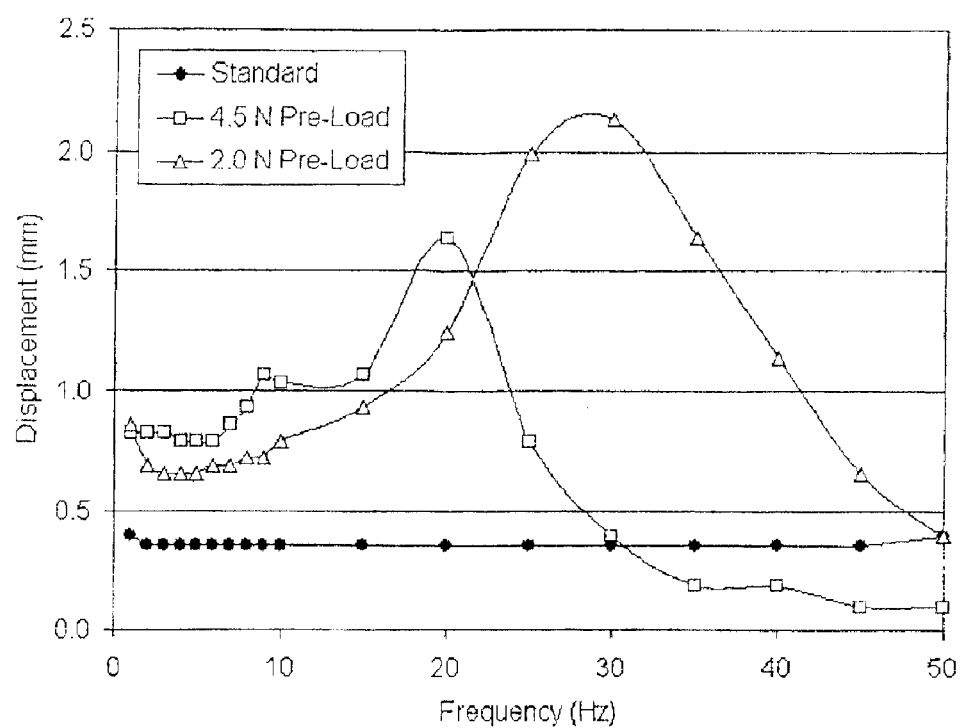
FIG. 8 illustrates the enhanced performance that can be obtained with spring modified electroactive composite structures under a 4.5 N pre-load and under a 2.0 N pre-load as compared to a prior art device that is not spring pre-loaded.

The standard device, i.e., with no tensioning device 19 included, was prepared by taping one end of the electroactive composite to the fixed block 13 and one end to the sled 16. In FIG. 8, the response of the standard device is graphically displayed as a function of the varied frequency. As can be seen, the total displacement of the standard device remained steady at about 0.4 mm and was essentially frequency-independent.

EXAMPLE 2

A THUNDER® actuator similar to that of Example 1 was placed between two posts. A mechanical pre-load was applied to the actuator by mounting an extended spring (FIG. 4, 19) between the two posts upon which the actuator was mounted, similar to that shown by the structure of FIG. 4. The actuator was held in place between the two poles by the force applied to the system from the spring. Different devices were prepared with various pre-loads ranging between about 2 and about 4 Newtons acting on the actuator in its static equilibrium condition. The same voltage as in Example 1 was applied to the modified systems.

The measured responses can be seen in FIG. 8. The total response varied between about 0.2 and about 2.5 mm depending upon the drive frequency. The addition of the mechanical pre-load to the actuator due to the tensioning device (i.e. spring) increased actuator performance or electromechanical response over that of the prior art device across most of the frequency range. For example, at 10 Hz, the 2.0 N pre-load modified device demonstrated a displacement response of about 0.65 mm compared to 0.4 mm for the standard device, while the 4.5 N pre-load modified device demonstrated a displacement response of about 1.05 mm compared to 0.4 mm for the standard device. These displacement represent improvements of about 60% and 150%, respectively. At resonance, the enhancements in displacement response for the two modified devices are more than 300% (2.0 N pre-load) and 450% (4.5 N pre-load). The decrease in the performance enhancement of the modified devices at higher frequencies is believed to be due to exceeding the natural resonance frequencies of the springs that were employed for these studies.

The modified devices exhibited greater total displacements across much of the frequency range and displayed a resonance frequency at which the displacement was maximized. The resonance frequency can be shifted to higher frequency by selecting a spring that has a higher force constant.

EXAMPLE 3

Figure 9:
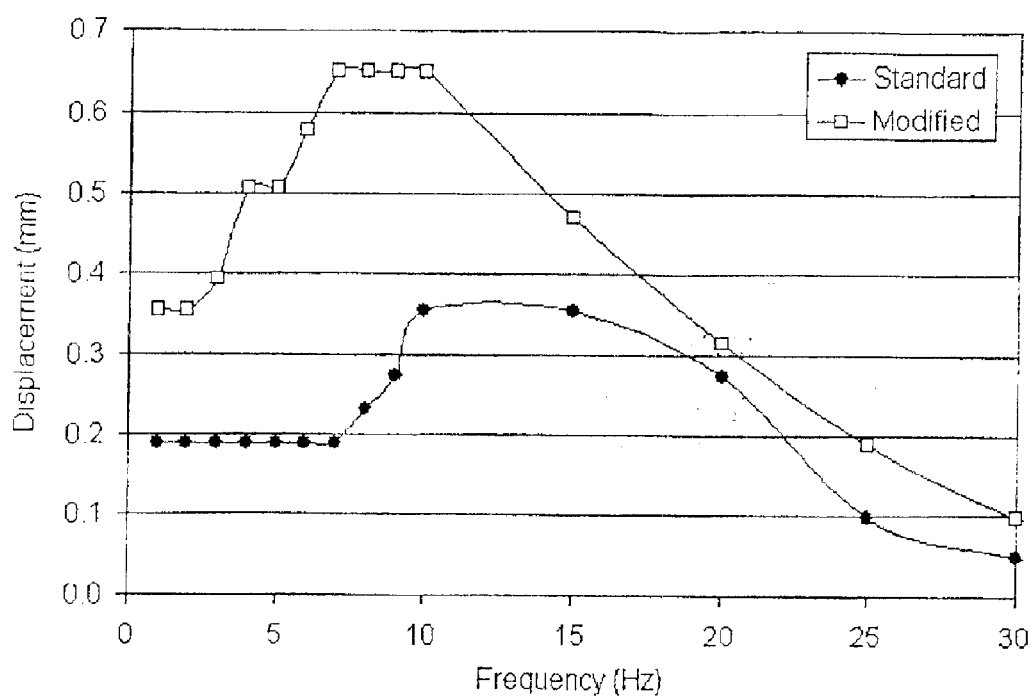
FIG. 9 illustrates the displacement response of a prior art actuator under an applied load of 100 grams compared to the response of a spring-modified actuator of the present invention under the same applied load.

FIG. 9 graphically illustrates the benefits of adding a mechanical pre-load to an electroactive composite structure when the structure has been loaded with an applied mass. The device provides work through movement of the mass in a vertical direction when an electrical voltage is applied across the electroactive structure.

Similar electroactive devices and voltage conditions were prepared as described in Examples 1 (standard device) and 2 (spring modified device), above. A 100 g mass was placed on the top center of the electroactive device prior to voltage application. A drive voltage of about 200 volts was applied to the devices over a frequency range of from about 0 to about 30 Hz.

As can be seen in FIG. 9, a maximum displacement of about 0.37 mm was observed for the standard device, while the modified device displayed a displacement of more than about 0.65 mm. The addition of the mechanical pre-load to the electroactive composite structure provided an improved electroactive device capable of moving an equivalent mass over a greater range of motion under the same electrical conditions than was possible with the prior art device.

It is to be understood by one of ordinary skill in the art that the present discussion is a description of exemplary embodiments only, and is not intended as limiting the broader aspects of the present invention, which broader aspects are embodied in the exemplary constructions. The invention is shown by example in the appended claims.

What is claimed is:

1. An electroactive device, comprising:
   an electroactive composite comprising an electroactive material defining a first edge and an opposite edge; and
   a tensioning device selected from the group consisting of a spring, a coil, or an elastic member located at a distance from the electroactive composite, wherein said tensioning device indirectly induces a mechanical pre-load comprising compressive forces between the first edge and the opposite edge to said electroactive material, said mechanical pre-load increasing lateral tensile stresses in the surface region of the electroactive composite when in static equilibrium.

2. The electroactive device of claim 1, wherein said electroactive composite comprises multiple layers, said electroactive material being one of said multiple layers.

3. The electroactive device of claim 2, wherein one of said layers is a support layer.

4. The electroactive device of claim 3, wherein said support layer is selected from the group consisting of metals, plastics, glass, cermets, carbon fiber composites, and ceramics.

5. The electroactive device of claim 2 further comprising one or more layers selected from the group consisting of polyimides and adhesives.

6. The electroactive device of claim 1 wherein said electroactive material is selected from the group consisting of ceramics and polymers.

7. The electroactive device of claim 1 wherein said electroactive material is selected from the group consisting of electrostrictive, ferroelectric, piezoelectric, electrooptic, pyroelectric, and magnetostrictive materials and combinations thereof.

8. The electroactive device of claim 1, wherein said electroactive material is a stress-biased electroactive material comprising a convex surface and a concave surface.

9. The electroactive device of claim 8 wherein said stress-biased electroactive material comprises a piezoelectric material having a pair of electrodes attached thereto, one electrode being attached to said convex surface, and the other electrode being attached to said concave surface.

10. The electroactive device of claim 1, wherein said electroactive composite comprises more than one electroactive material.

11. The electroactive device of claim 10, wherein at least one of said electroactive materials is selected from the group consisting of a piezoelectric material and an electrostrictive material.

12. The electroactive device of claim 1, wherein said tensioning device comprises an elastic member, the member being selected from the group consisting of silicone rubber, natural rubber, neoprene rubber, butyl rubber, chlorosulfonated polyethylene, and elastomers.

13. The electroactive device of claim 1, wherein said tensioning device is an elastomeric loop.

14. The electroactive device of claim 1, wherein said electroactive device comprises more than one electroactive composite.

15. An electroactive device, comprising:
   an electroactive composite comprising an electroactive material;
   a tensioning device, wherein said tensioning device induces a mechanical pre-load to said electroactive material; and
   an applied mass, wherein the force of said applied mass to said electroactive device is counteracted by the force of said mechanical pre-load.

16. An electroactive device, comprising:
   a stress-biased electroactive composite comprising a pre-stressed, domed electroactive material layer defining a first edge and an opposite edge; and
   a tensioning device, wherein said tensioning device contacts said electroactive composite at at least two points such that said two points are in opposed relation to each other across said electroactive composite thereby inducing a mechanical pre-load comprising compressive forces between the first edge and the opposite edge to said electroactive material layer, said mechanical pre-load increasing lateral tensile stresses in the surface region of the electroactive composite when in static equilibrium.

17. The electroactive device of claim 16, wherein said electroactive composite further comprises a support layer selected from the group consisting of metals, plastics, glass, cermets, carbon fiber composites, and ceramics.

18. The electroactive device of claim 16 wherein said electroactive material is selected from the group consisting of electrostrictive, ferroelectric, piezoelectric, electrooptic, pyroelectric, and magnetostrictive materials and combinations thereof.

19. The electroactive device of claim 16, wherein said electroactive composite comprises more than one electroactive material.

20. The electroactive device of claim 19, wherein at least one of said electroactive materials is chosen from the group consisting of a piezoelectric material and an electrostrictive material.

21. The electroactive device of claim 16 further comprising one or more layers selected from the group consisting of polyimides and adhesives.

22. The electroactive device of claim 16, wherein said tensioning device is selected from the group consisting of an elastomeric material, a spring, and a vise.

23. The electroactive device of claim 16, comprising more than one stress-biased electroactive composite.

24. A method for improving the electromechanical response of an electroactive device comprising:
   providing an electroactive composite comprising an electroactive material defining a first edge and an opposite edge; and
   indirectly inducing a mechanical pre-load comprising a compressive force between said first edge and said opposite edge to said electroactive composite by use of a tensioning device selected from the group consisting of a spring, a coil, or an elastic member, wherein said tensioning device does not contact said electroactive composite, said mechanical pre-load increasing lateral tensile stresses in the surface region of the electroactive composite when in static equilibrium.

25. The method of claim 24, wherein inducing said mechanical pre-load increases the mechanical energy of said electroactive device.

26. The method of claim 24, wherein inducing said mechanical pre-load increases the stored elastic energy of said electroactive device.

27. The method of claim 24, wherein inducing said mechanical pre-load alters the stress profile of said electroactive device and increases the surface tensile stress of said electroactive material.

28. The method of claim 24, wherein said electroactive composite is a domed, pre-stressed electroactive composite, and wherein inducing said mechanical pre-load increases the static equilibrium dome height of said electroactive composite.

29. The method of claim 28, wherein inducing said mechanical pre-load increases the static equilibrium dome height of said electroactive composite by at least about 10%.

30. The method of claim 28, wherein inducing said mechanical pre-load increases the static equilibrium dome height of said electroactive composite by about 25%.

31. The method of claim 24, wherein inducing said mechanical pre-load increases the deformation resistance of said electroactive device.

32. A method of increasing the stored elastic energy of an electroactive device comprising:
   providing a stress-biased electroactive device comprising a pre-stressed, domed electroactive composite defining a first edge and an opposite edge; and
   connecting a tensioning device placed under a tension to said electroactive device such that said electroactive composite is deformed with an increased curvature and a mechanical pre-load comprising compressive forces between said first edge and said opposite edge is induced to said electroactive composite, wherein said tensioning device contacts said electroactive composite at at least two points such that said two points are in opposed relation to each other across said electroactive composite, said mechanical pre-load increasing lateral tensile stresses in the surface region of the electroactive composite when in static equilibrium.

33. The method of claim 32, wherein said stored elastic energy is partially released during operation of said electroactive device.

34. An electroactive device, comprising:
   a stress-biased electroactive composite comprising a pre-stressed, domed electroactive material layer;
   a tensioning device, wherein said tensioning device induces a mechanical pre-load to said electroactive material layer; and
   a movable sled, wherein said tensioning device is located at a distance from said electroactive composite, such that said mechanical pre-load is indirectly induced to said electroactive composite through said moveable sled.

35. The electroactive device of claim 34, further comprising added weight, wherein said added weight increases the inertia of said movable sled.

* * * * *